US009388326B2

(12) United States Patent
Montarnal et al.

(10) Patent No.: US 9,388,326 B2
(45) Date of Patent: Jul. 12, 2016

(54) COMPOSITIONS FOR CONTROLLED ASSEMBLY AND IMPROVED ORDERING OF SILICON-CONTAINING BLOCK COPOLYMERS

(71) Applicant: The Regents of the University of California, Oakland, CA (US)

(72) Inventors: Damien Montarnal, Maubec (FR); Craig J. Hawker, Santa Barbara, CA (US); Edward J. Kramer, Santa Barbara, CA (US); Glenn H. Fredrickson, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/849,289

(22) Filed: Sep. 9, 2015

(65) Prior Publication Data

US 2015/0376455 A1    Dec. 31, 2015

Related U.S. Application Data

(62) Division of application No. 14/153,355, filed on Jan. 13, 2014, now Pat. No. 9,158,200.

(60) Provisional application No. 61/752,243, filed on Jan. 14, 2013.

(51) Int. Cl.
*G03F 7/004* (2006.01)
*C09D 183/12* (2006.01)
*C08K 5/092* (2006.01)
(Continued)

(52) U.S. Cl.
CPC .............. *C09D 183/12* (2013.01); *C08K 5/092* (2013.01); *C08L 53/00* (2013.01); *G03F 7/0002* (2013.01); *G03F 7/075* (2013.01); *G03F 7/11* (2013.01); *G03F 7/40* (2013.01); *H01L 21/3105* (2013.01); *H01L 21/31144* (2013.01)

(58) Field of Classification Search
CPC ............. G03F 7/075; G03F 7/40; G03F 7/30; G03F 7/11; H01L 21/0274; H01L 21/3105; H01L 21/31144; H01L 21/31116; H01L 21/312; C08K 5/092
USPC ........ 430/270.1, 271.1, 273.1, 322, 314, 313, 430/317, 325, 329, 331; 216/41, 47, 51
See application file for complete search history.

(56) References Cited

U.S. PATENT DOCUMENTS

| 2008/0182402 | A1  | 7/2008  | Li et al. |
| 2009/0202952 | A1  | 8/2009  | Abraham et al. |
| 2009/0273051 | A1  | 11/2009 | Parekh et al. |
| 2011/0086985 | A1* | 4/2011  | Watkins ................. C08G 81/00 525/333.3 |
| 2012/0273762 | A1  | 11/2012 | Scherer et al. |
| 2013/0288482 | A1* | 10/2013 | Nam .................... H01L 21/0273 438/703 |

OTHER PUBLICATIONS

Sakurai, Shinichi, et al. "Evaluation of segmental interaction by small-angle X-ray scattering based on the random-phase approximation for asymmetric, polydisperse triblock copolymers." Macromolecules 25.10 (1992): 2679-2691.

* cited by examiner

*Primary Examiner* — Amanda C Walke
(74) *Attorney, Agent, or Firm* — Gates & Cooper LLP

(57) ABSTRACT

The invention provides compositions and methods for inducing and enhancing order and nanostructures in organosilicon block copolymers compositions by including certain organic additives in such compositions that include one or more moieties comprising a hydrogen bond acceptor or a hydrogen bond donor. Such block copolymer compositions may be used, for example, as a mask for lithographic patterning as is used, for example, during various stages of semiconductor device fabrication.

19 Claims, 14 Drawing Sheets

(51) Int. Cl.
*G03F 7/075* (2006.01)
*G03F 7/40* (2006.01)
*C08L 53/00* (2006.01)
*H01L 21/311* (2006.01)
*G03F 7/11* (2006.01)
*H01L 21/3105* (2006.01)
*G03F 7/00* (2006.01)

COMPOSITIONS FOR CONTROLLED ASSEMBLY AND IMPROVED ORDERING OF SILICON-CONTAINING BLOCK COPOLYMERS

CROSS-REFERENCE TO RELATED APPLICATIONS

This application is a divisional application that claims the benefit under 35 U.S.C. §121 of U.S. patent application Ser. No. 14/153,355, titled "COMPOSITIONS FOR CONTROLLED ASSEMBLY AND IMPROVED ORDERING OF SILICON-CONTAINING BLOCK COPOLYMERS", filed Jan. 13, 2014, which claims priority under 35 U.S.C. §119(e) of U.S. Provisional Patent Application Ser. No. 61/752,243, titled "COMPOSITIONS FOR CONTROLLED ASSEMBLY AND IMPROVED ORDERING OF SILICON-CONTAINING BLOCK COPOLYMERS", filed Jan. 14, 2013, the contents of which are incorporated herein by reference.

TECHNICAL FIELD

The invention generally relates to polymer compositions and their uses. More particularly, the invention relates to compositions of ordered, nanostructured copolymers, and methods of making and using these materials in various applications such as lithography.

BACKGROUND OF THE INVENTION

Ordered and nanostructured polymer compositions can be used in a variety of contexts for the production of materials having a number of desirable properties including an ability to form structures having small three dimensional architectures. The material properties of such polymer compositions can be tailored to provide useful materials in a variety of technologies such as those used in photovoltaic systems, photonic crystal systems, nano-porous membrane systems and nanolithographic systems.

Nanostructured materials often are used to refer to materials whose structural elements have dimensions in the 1 nm to about 100 nm range. One particularly useful class of nanostructured materials includes block copolymers. Block copolymers can assemble to form nanoscale domains on a periodic lattice. For example, well ordered block copolymer thin films have been used as templates to pattern microelectronic devices and magnetic storage media, as sacrificial templates for the fabrication of inorganic mesostructured materials and for the preparation of polymeric nanoporous materials. Among the technological challenges for implementing block copolymer directed assembly is the need to achieve well ordered systems using components that do not compromise the operability of the systems in which these materials are implemented.

One approach to producing ordered materials begins with a segregated block copolymer template. In the absence of kinetic limitations, the phase segregation of A-B and A-B-A diblock and triblock copolymers is thermodynamically governed by the product $\chi N$ where $\chi$ is the Flory-Huggins interaction parameter between the two dissimilar blocks and N is the total number of repeat units in all the blocks of the block copolymer. Upon segregation, the morphology is governed primarily by the relative volume fraction of the two blocks although the segregation strength of microphase segregated systems also plays a role near the phase boundaries. While small domain sizes are desirable, a challenge for achieving small domain sizes is that decreases in molar mass required to decrease the inter-domain spacing also weaken the segregation strength.

Methods and/or materials effective in inducing and increasing order and nanostructures in polymeric materials are strongly desired, particularly for polymeric materials used in various industries (e.g. materials used in three dimensional microfabrication technologies such as nanolithography). For this reason, the development of improved polymer compositions and/or lithography methods and systems that can utilize such compositions represents a significant breakthrough in this technical field.

SUMMARY OF THE INVENTION

The invention disclosed herein provides methods, materials and systems that allow for the facile control of silicon-containing block-copolymer nanostructures through the use of certain organic additives. Embodiments of the invention are useful in a wide variety of fields where the control over the structure of block copolymers is desirable. For example, the properties of the polymer compositions disclosed herein can be tailored to provide materials useful in photovoltaic systems, photonic crystal systems, nano-porous membrane systems, nanolithographic systems and the like.

The invention disclosed herein has a number of embodiments that include methods, materials and systems for making and using block-copolymer compositions having organic additives that modulate hydrogen bonding in such compositions. Illustrative embodiments of the invention include compositions of matter comprising a block copolymer including an organosilicon block, an organic block, and one or more moieties comprising a hydrogen bond donor or a hydrogen bond acceptor. Such block copolymer compositions further include an organic additive including one or more moieties comprising a hydrogen bond acceptor or a hydrogen bond donor. In such compositions, hydrogen bonds formed between the moieties in the block copolymer and the moieties in the organic additive produce ordered arrangements of atoms in the composition. In these compositions, the ordered arrangements of atoms that result from such hydrogen bonds function to modulate one or more material properties of the compositions. Typically for example, the ordered arrangements of atoms in the composition increase the segregation strength of the block copolymer and/or increase the glass transition temperature of the block copolymer; and/or inhibit crystallization of the block copolymer.

In some compositions of the invention, the organic block of the block copolymer comprises one or more moieties having a hydrogen bond acceptor and the organic additive comprises one or more moieties having a hydrogen bond donor. Optionally, for example, the block copolymer comprises a poly (ethylene oxide) block, a poly(methyl methacrylate) (PMMA) block, a poly(4-vinylpyridine) (P4VP) block or a P4VP-r-PMMA block; in combination with a polydimethylsiloxane block. In certain embodiments of the invention, the organic additive that forms hydrogen bonds with the copolymers comprises a monosaccharide, a polyphenol, an aromatic polyacid or a 2,3-dihydroxybutanedioic acid. In some embodiments of the invention, the molecular weight of the additive is lower than 800 g/mol, preferably lower than 600 g/mol and more preferably lower than 400 g/mol. In addition, the compositions of matter disclosed herein can also include further materials. For example, in some embodiments of the invention, the composition further includes a material such as a silicon oxide material, with the block copolymer forming a discrete layer over a surface of this material.

Embodiments of the invention include lithographic methods (e.g. methods designed to form structures having features between 5 and 100 nm in size). In some embodiments of the invention, such methods comprise the steps of forming a layer of a mask material over a substrate comprising one or more layers of material, wherein the mask material comprises a block copolymer composition that includes an organosilicon block, an organic block, one or more moieties comprising a hydrogen bond donor or a hydrogen bond acceptor, and an organic additive including one or more moieties comprising a hydrogen bond acceptor or a hydrogen bond donor. In such methods, the hydrogen bonds formed between the moieties in the block copolymer and the moieties in the organic additive produce ordered arrangements of atoms in the composition that facilitate the formation of nano-structures (e.g. those of an approximately 10-nm scale). Optionally, the specific additive used in these methods is selected for an ability to selectively swell the organosilicon block or the organic block, thereby increasing a size of a feature formed by the method.

Lithographic methods of the invention can include the step of annealing a mask material on a substrate followed by one or more etching steps. Typically for example, the annealed mask material is subsequently exposed to an etching process (e.g. oxygen reactive ion etching) selected for its ability to etch the organic block and the organic additive of the block copolymer composition in a manner that exposes a portion of the layered substrate. Certain embodiments can further include exposing the substrate to an additional etching process selected for its ability to etch the portion of the substrate exposed by the previous etching step(s). Embodiments of the invention can include additional methodological steps, for example those designed to remove residual polymer following the formation of the etched substrate. Using these methods, structures having features between 5 and 100 nm in size can be formed. In typical embodiments of the invention the structures formed by these methods can comprise apertures, pores, channels, columns or wires.

Related embodiments of the invention comprise lithography systems. Typically these systems comprise a substrate comprising at least one layered material (e.g. one comprising a layer of a silicon oxide) and a mask composition disposed over this substrate. In these systems, the mask composition comprises a block copolymer including an organosilicon block, an organic block, and one or more moieties comprising a hydrogen bond donor or a hydrogen bond acceptor as well as the organic additive including one or more moieties comprising a hydrogen bond acceptor or a hydrogen bond donor. As discussed above, these compositions are shown to be particularly useful in lithographic systems due to the fact that the hydrogen bonds formed between the moieties in the block copolymer and the moieties in the organic additive produce ordered arrangements of atoms in the composition. In some embodiments, these lithography systems are used to fabricate repeating structures having features that are between 5 and 100 nm in size (e.g. pores, channels, columns or wires). Such repeating structures include, for example, a plurality of pores, channels, wires etc. that are disposed on a surface in a pattern (such as an array).

Embodiments of the invention also provide articles of manufacture and kits useful in lithographic processes. In one illustrative embodiment, the kit includes polymeric compositions as disclosed herein (or one or more reagents used to form the polymeric compositions disclosed herein) in combination with other materials useful to fabricate nanostructures such as substrates comprising one or more layered materials and the like.

DETAILED DESCRIPTION OF THE INVENTION

Figure 1:
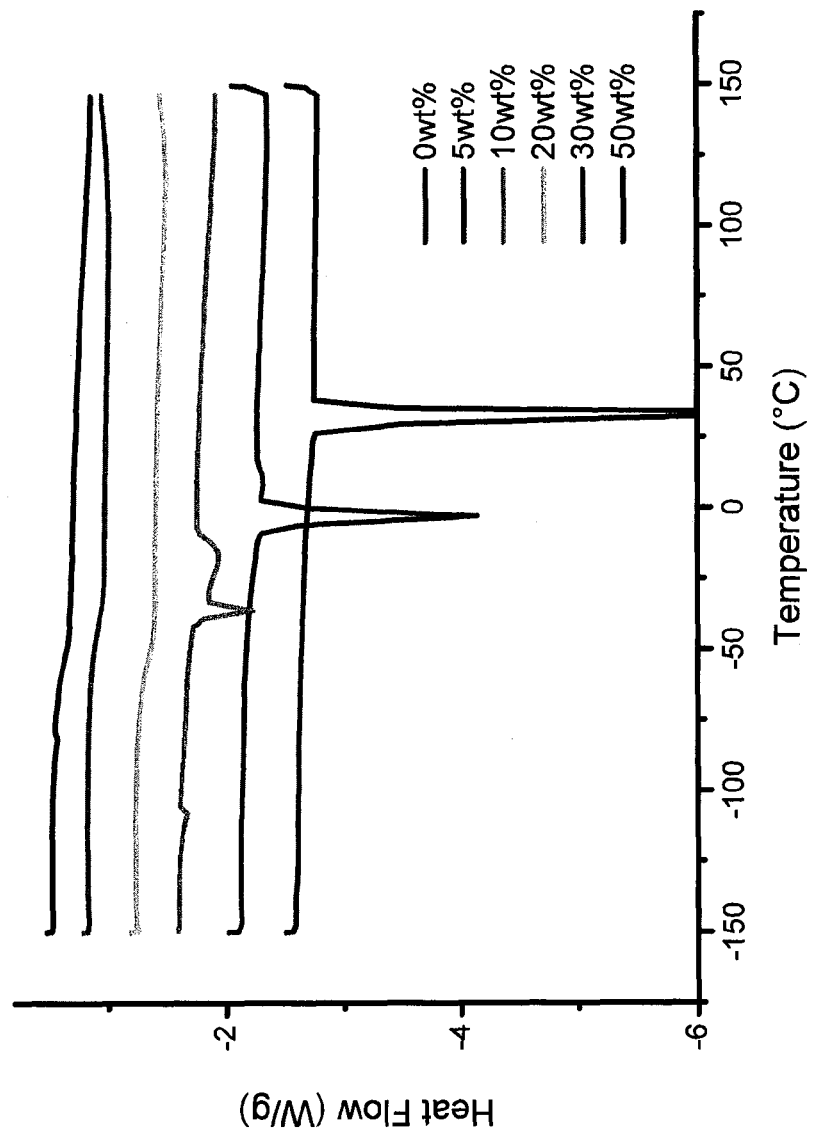
FIG. 1 shows differential scanning calorimetry (DSC) thermograms (10° C./min) of PEO-PDMS blended with (L)-tartaric acid (0, 5, 10, 20, 30 and 50 wt % from bottom to top). The cooling cycle is represented.

Unless otherwise defined, all terms of art, notations and other scientific terms or terminology used herein are intended to have the meanings commonly understood by those of skill in the art to which this invention pertains. All publications mentioned herein are incorporated herein by reference to disclose and describe aspects, methods and/or materials in connection with the cited publications. All numbers recited in the specification and associated claims that refer to values that can be numerically characterized can be modified by the term "about".

The invention disclosed herein provides methods, materials and systems that allow for the facile control of silicon-containing block-copolymer nanostructures. The invention is based in part on the discovery that orders and nanostructures may be induced or enhanced in block copolymer by certain organic additives selected to include one or more moieties comprising a hydrogen bond acceptor or a hydrogen bond donor. Embodiments of the invention are useful in the wide variety of fields where precise control over the structure of block copolymers is desirable. For example, the properties of the polymer compositions disclosed herein can be tailored to provide materials useful in photovoltaic systems, photonic crystal systems, nano-porous membrane systems, lithographic systems and the like. Aspects of the invention are discussed in detail below.

Embodiments of the invention include methods for making and using block copolymer compositions. As used herein, the term "block copolymer" means and includes a polymer composed of chains where each chain contains two or more polymer blocks. As used herein, the term "polymer block" means and includes a grouping of multiple monomer units (e.g. a homopolymer block) or multiple types (e.g. a copolymer block, a random copolymer block, etc.) of constitutional units into a continuous polymer chain of some length that forms part of a larger polymer of an even greater length. A wide variety of block copolymers useful in embodiments of the invention are contemplated herein including diblock copolymers (i.e., polymers including two polymer blocks), triblock copolymers (i.e., polymers including three polymer blocks), multiblock copolymers (i.e., polymers including more than three polymer blocks), and combinations thereof.

A self-assembling block copolymer typically contains two or more different polymeric block components, for example components A and B, that are immiscible with one another. Under suitable conditions, the two or more immiscible polymeric block components separate into two or more different phases or microdomains on the 1 to 100 nanometer scale and thereby form ordered patterns of isolated nano-sized structural units. There are many types of block copolymers that can be used for forming the self-assembled periodic patterns. If one of the components A or B is selectively removable without having to remove the other, then orderly arranged structural units of the un-removed component can be formed.

Embodiments of the invention include silicon-containing block copolymers that can be used in processes designed to form periodic nanometer (nm) scale features. For example, for lithographic applications, silicon-containing polymers can provide a robust and highly selective mask for standard plasma etching techniques, such as oxygen reactive ion etching. In addition, silicon-containing monomers display a high Flory-Huggins ($\chi$) parameter with most organic monomers. This favors the phase-separation of block copolymers, even those with low molecular weights (<20 kg/mol), into well-organized structures with small feature sizes. In PEO-PDMS copolymers, the high Flory-Huggins parameter between polyethylene oxide (PEO) and polydimethylsiloxane (PDMS) allows for enhanced phase-segregation of very low molecular weight copolymers (<4 kg/mol) at the 10 nm scale. The practical use of such copolymers is however limited by the crystallization of PEO domains at room temperature since crystallization usually results in the destruction of the 10-nm scale nano-structure. As disclosed herein, blending organic additives such as (L)-tartaric acid with PEO-PDMS copolymers not only suppresses crystallization of the PEO block, but also greatly enhances the segregation strength and induces long range ordering in the bulk. This feature of (L)-tartaric acid is attributed to its affinity with PEO due to hydrogen bonding between the two species, as well as the very strong incompatibility of (L)-tartaric acid with PDMS. This remarkable phenomenon applies to other block copolymer/additive systems where one of the blocks is silicon-based while the other is a hydrogen bond acceptor, and where the additive is a hydrogen bond donor organic molecule. Similarly, systems where one of the blocks is silicon-based while the other is a hydrogen bond donor, and where the additive is a hydrogen bond acceptor organic molecule will also display such advantages.

The invention disclosed herein has a number of embodiments that include methods, materials and systems for making and using block-copolymer compositions having organic additives that modulate hydrogen bonding in such compositions. Illustrative embodiments of the invention include compositions of matter comprising a block copolymer including an organosilicon block, an organic block; and one or more moieties comprising a hydrogen bond donor or a hydrogen bond acceptor. Such block copolymer compositions further include an organic additive including one or more moieties comprising a hydrogen bond acceptor or a hydrogen bond donor. In such compositions, hydrogen bonds formed between the moieties in the block copolymer and the moieties in the organic additive produce ordered arrangements of atoms in the composition. In addition, the compositions of matter disclosed herein can include further materials. For example, in some embodiments of the invention, the composition further includes a metallic and/or silicon oxide, with the block copolymer forming a discrete layer over a surface of this oxide.

As is known in the art, a hydrogen bond is the electromagnetic attractive interaction of a hydrogen atom and an electronegative atom that comes from another molecule or chemical group. The present invention demonstrates that organic additives that contain hydrogen bonding sites (such as carboxylic acid, phenol, urea, urethane, amide and amine moieties) can effectively induce order in polymeric architectures in a manner that results in the formation of well ordered materials. In this context, in some compositions of the invention, an organic block of the block copolymer comprises one or more moieties having a hydrogen bond acceptor and an organic additive comprises one or more moieties having a hydrogen bond donor. In other compositions of the invention, the organic block of the block copolymer comprises one or more moieties having a hydrogen bond donor and the organic additive comprises one or more moieties having a hydrogen bond acceptor. Optionally, for example, the block copolymer comprises a poly(ethylene oxide) block; and/or a polydimethylsiloxane block. In certain embodiments of the invention, the organic additive having moieties that form hydrogen bonds with the copolymers comprises a monosaccharide, a polyphenol, an aromatic polyacid or a 2,3-dihydroxybutanedioic acid. In certain embodiments of the invention, the organic additive is selected to have a molecular weight within a certain range (e.g. between 100 and 1000 g/mol, or between 500-100 g/mol, or between 200-800 g/mol etc.), or is selected to have a molecular weight that is lower than 1000 g/mol, or lower than 900 g/mol, or lower than 800 g/mol, or lower than 700 g/mol, or lower than 600 g/mol, or lower than 500 g/mol, or lower than 400 g/mol, or lower than 300 g/mol, or lower than 200 g/mol. In some embodiments of the invention, the additive is a non-polymeric organic additive.

As disclosed herein, mediating the interactions between block copolymers and additives via hydrogen bonding is advantageous in part because the strength of such interactions may be controlled by the chemical identity and quantity of hydrogen bonding groups, temperature and the presence of other compounds such as solvents. For example, hydrogen bonding can be strong enough to overcome the tendency of random uncorrelated thermal motion of individual molecules and to offset the entropic penalty associated with the linear arrangement of molecules to form supramolecular assembly. The benefits of using additives to modify the base block copolymer include, for example, the advantage that specialty block copolymers need not be synthesized at different molecular weights and volume fractions. As disclosed herein, certain concentration ranges for additive are also shown to be useful in specific embodiments of the invention. For example, in some embodiments of the invention, the additive comprises from 10 to 40 weight % of the composition. In certain embodiments of the invention, the additive comprises from 15 to 30 weight % of the composition.

In embodiments of the invention, a specific additive compound (e.g. tartaric acid as disclosed in the working examples) can be selected for use in a composition due to an ability to form hydrogen bonds with chemical moieties in a block of the block copolymer. For example, a specific additive compound can be selected for use in an embodiment of the invention due to its ability to form H-bonds with H-bonding acceptor moieties present in a polymer block. Such H-bonding acceptor moieties are well known in the art and can be found, for example, in polyethers such as polypropylene oxide), poly(ethylene oxide) and poly(allyl glycidyl ether), in polyacrylates such as poly(methyl methacrylate), poly(acrylonitrile), in a poly(vinyl-4-pyridine), a poly(vinyl-2-pyridine), a poly(vinyl pyrrolidone), a poly(lactic acid), a poly(ε-caprolactone), poly(vinyl acetate) or the like.

In the compositions of the invention, the ordered arrangements of atoms in the composition that results from hydrogen bonds function to modulate one or more material properties of the compositions. Moreover, embodiments of the invention offer a number of benefits that allow extensive control over phase separation of block copolymers containing a silicon-containing block and a hydrogen bond acceptor block. By merely blending the block copolymer with certain non-polymeric organic hydrogen bond donor (or acceptor) molecules, it is possible to increase significantly the segregation strength of the block copolymer, and enhanced ordering. Typically for example, the ordered arrangements of atoms in the composition increase the segregation strength of the block copolymer and/or increase the glass transition temperature of the block copolymer (e.g. so as to improve its mechanical strength); and/or inhibit crystallization of the block copolymer. Such ordered arrangements of atoms in the composition can also induce order in low molecular weight copolymers that would not otherwise adequately self-assemble. This property consequently allows decreased size ordering features. Such ordered arrangements of atoms in the composition can also be used to control the volume of the hydrogen bonding acceptor block, by selectively swelling it with the additive. This property allows one to create a range of feature sizes and/or provides a means to fine-tune feature sizes.

Illustrative embodiments of the invention include a copolymer consisting of an organic block and an organosilicon block (e.g. a polyol block and a siloxane block). As used herein, the term "organic" as in the "organic block" of a block copolymer or "organic additive" refers to compounds containing organic atoms such as carbon, hydrogen, nitrogen and oxygen but not silicon nor transition metals. As used herein, the term "organosilicon" as in the organosilicon block of a block copolymer refers to organic compounds containing carbon silicon bonds. Optionally in embodiments of the invention, an organosilicon component includes a silicone group selected from the group of an ($SiR_2O$), an ($SiR_2NR$) group, an ($SiRO_{2/3}$) group, and combinations thereof, wherein R is selected from the group of an amino group, a hydroxyl group, an ether group, a carboxyl group, hydrogen, a phenyl group, a hydrocarbon group, and combinations thereof. For example, in some embodiments, the organosilicon component is a dialkyl silane, or a polymer of the dialkyl silane, such as poly(dimethyl siloxane). In other embodiments, the organosilicon component includes a poly (silazane). However, it is to be appreciated that R may be any functional organic group.

In embodiments of the invention, a block copolymer the invention can include a silicon-containing block, an organic block containing hydrogen bonding acceptor or donor moiety and optionally one or more additional blocks of a different composition. In this context, preferred silicon containing polymers useful in embodiments of the invention include, for example, poly(dimethyl siloxane) (PDMS), poly(ferrocenyldimethylsilane) (PFS), poly(trimethylsilylstyrene) (PT-MSS), poly(3-tri(methoxysilyil)propyl methacrylate), poly (3-acryloxypropyltrimethoxysilane), poly (methylsilsesquioxane) and the like, poly(dimethylsilazane), poly(tetramethyl-p-silphenylene siloxane), and poly(Allyldimethylsilane). Preferred hydrogen bonding donors or acceptors useful in embodiments of the invention include, for example, polyacrylates such as: poly(methyl methacrylate) (PMMA), poly(methyl acrylate) (PMA), poly(ethyl acrylate), poly(isobornyl acrylate), poly(acrylic acid) (PAA), poly (acrylamide), poly(N-alkylacrylamide), poly(N,N-dialkylacrylamide) and the like; polyesters such as: poly(lactic acid) (PLA) and poly(caprolactone) (PCL); polyamides and polypeptides, polyurethanes, polysulfones; polyethers such as: poly(ethylene oxide) (PEO), polypropylene oxide) (PPO); polycarbonates; poly(4-vinylpyridine) (P4VP), poly(2-vinylpyridine) (P2VP); hydroxypropyl methylcellulose; poly (vinyl alcohol) (PVA), polyvinyl ether, poly(vinyl acetate); poly(ethyloxazoline), dextran, oligosaccharides and the like. Preferred other illustrative polymers useful in embodiments of the invention include, for example, polystyrenes (PS), polyolefins such as: polyethylene (PE), polypropylene (PP), polycyclic olefin, poly(isoprene) (PI), poly(ethylethylene), poly(butadiene) (PB); polychloroprene (CR), poly(vinyl chloride) (PVC), poly(tetrafluoroethylene) (PTFE), fluorinated poly(isoprene) and poly(butadiene) (FPB and FPI), poly(9,9-bis(6'-N,N,Ntrimethylammonium)-hexyl)-fluorene phenylene bromide) and polyimides.

The polymers identified immediately above are provided as examples of chemical structures useful in embodiments of the invention. These are non-limiting examples, and artisans in this technology understand that a large number of different chemical blocks can be joined together in various combinations in order to form a wide variety of different embodiments of the invention. Illustrative polymer block constituents and copolymers that can be formed include for example, one or more of: a polystyrene-poly(dimethyl siloxane) block copolymer, a poly(dimethyl siloxane)-methyl methacrylate (MMA) graft copolymer, a poly(dimethyl siloxane)-methyl acrylate graft copolymer, a poly(dimethyl siloxane)-ethyl acrylate graft copolymer, a methyl acrylate-isobornyl acrylate-poly(dimethyl siloxane) graft copolymer, a polystyrene-poly(dimethyl siloxane) graft copolymer, a poly(cyclic olefin)-poly(dimethyl siloxane) graft copolymer, a polysiloxane-poly(ester) copolymer, a polysiloxane-polyamide copolymer, polysiloxane-polyimide copolymer, a polysiloxane-polyurethane copolymer, a polysiloxane-polysulfone copolymer, a polysiloxane-polyether copolymer, and a polysiloxane-polycarbonate copolymer. Similarly, by way of additional non-limiting examples, the block copolymer can also include one or more of: a poly(styrene), a poly(4-hydroxystyrene), a poly(dimethylsiloxane), a poly(4-vinylpyridine), a poly(methylmethacrylate), a poly(ethyleneoxide), a poly(isoprene), a poly(butadiene), a poly(lactic acid), a poly (2-vinylpyridine), and combinations thereof. As additional non-limiting examples, polymeric blocks that may be used for forming the block copolymers of the invention can include, for example, polystyrene-block-polydimethylsiloxane (PS-b-PDMS), polystyrene-block-poly(4-vinylpyridine) (PS-b-4PVP), polystyrene-block-poly(9,9-bis(6'-N,N,Ntrimethylammonium)-hexyl)-fluorene phenylene) (PS-b-PFP), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA). In certain embodiments of the invention, polymeric blocks used in embodiments of the invention comprise poly(9,9-bis(6'-N,N, Ntrimethylammonium)-hexyl)-fluorene phenylene) (PFP), polydimethylsiloxane (PDMS), poly(4-vinylpyridine) (4PVP), hydroxypropyl methylcellulose (HPMC), polyethylene glycol (PEG), poly(ethylene oxide)-co-poly(propylene oxide) di- or multiblock copolymers, poly(vinyl alcohol) (PVA), poly(ethylene-co-vinyl alcohol), poly(acrylic acid), poly(ethyloxazoline), a poly(alkylacrylate), poly(acrylamide), a poly(N-alkylacrylamide), a poly(N,N-dialkylacrylamide), poly(propylene glycol) (PPG), poly(propylene oxide), partially or fully hydrolyzed poly(vinyl alcohol), dextran, polystyrene (PS), polyethylene (PE), polypropylene (PP), polychloroprene (CR), a polyvinyl ether, poly(vinyl acetate), poly(vinyl chloride) (PVC), a polysiloxane, a polyurethane (PU), a polyacrylate, and a polyacrylamide. In certain embodiments of the invention, the block copolymer is selected due to its molecular weight. For example, silicon-containing monomers display a high Flory-Huggins ($\chi$) parameter with most organic monomers. This favors the phase-separation of block copolymers, even those with low molecular weights (<20 kg/mol), into well-organized structures with small feature sizes. In certain embodiments of the invention, the block copolymer has a molecular weight less than 20 kg/mol. In other embodiments of the invention, the block copolymer has a molecular weight less than 15, 10, 5 or 4 kg/mol. Embodiments of the invention include methods for making and using the disclosed compositions. For example, embodiments of the invention include methods for making the compositions disclosed herein by combining a block copolymer comprising an organosilicon block, an organic block and one or more moieties comprising a hydrogen bond donor or a hydrogen bond acceptor, with an organic additive including one or more moieties comprising a hydrogen bond acceptor or a hydrogen bond donor. In such methods, the constituents are combined so that hydrogen bonds formed between the moieties in the block copolymer and the moieties in the organic additive produce ordered arrangements of atoms in the composition that facilitate the formation of nanostructures (e.g. those of an approximately 10-nm scale).

Related embodiments of the invention include methods for introducing order into the morphology of a block copolymer composition. Such methods can include: providing a block copolymer melt, wherein the block copolymer having functional groups capable of forming hydrogen bonds; and adding to the block copolymer melt an organic additive, the additive comprising one or more functional groups thereon that form hydrogen bonds with the block copolymer. Related embodiments of the invention include methods for increasing a nanostructure to a block copolymer composition. Such methods can include a method for introducing order into the morphology of a block copolymer composition, comprising: providing a block copolymer melt, wherein the block copolymer having functional groups capable of forming hydrogen bonds; and adding to the block copolymer melt an additive having one or more functional groups thereon that form hydrogen bonds with the block copolymer.

Figure 12:
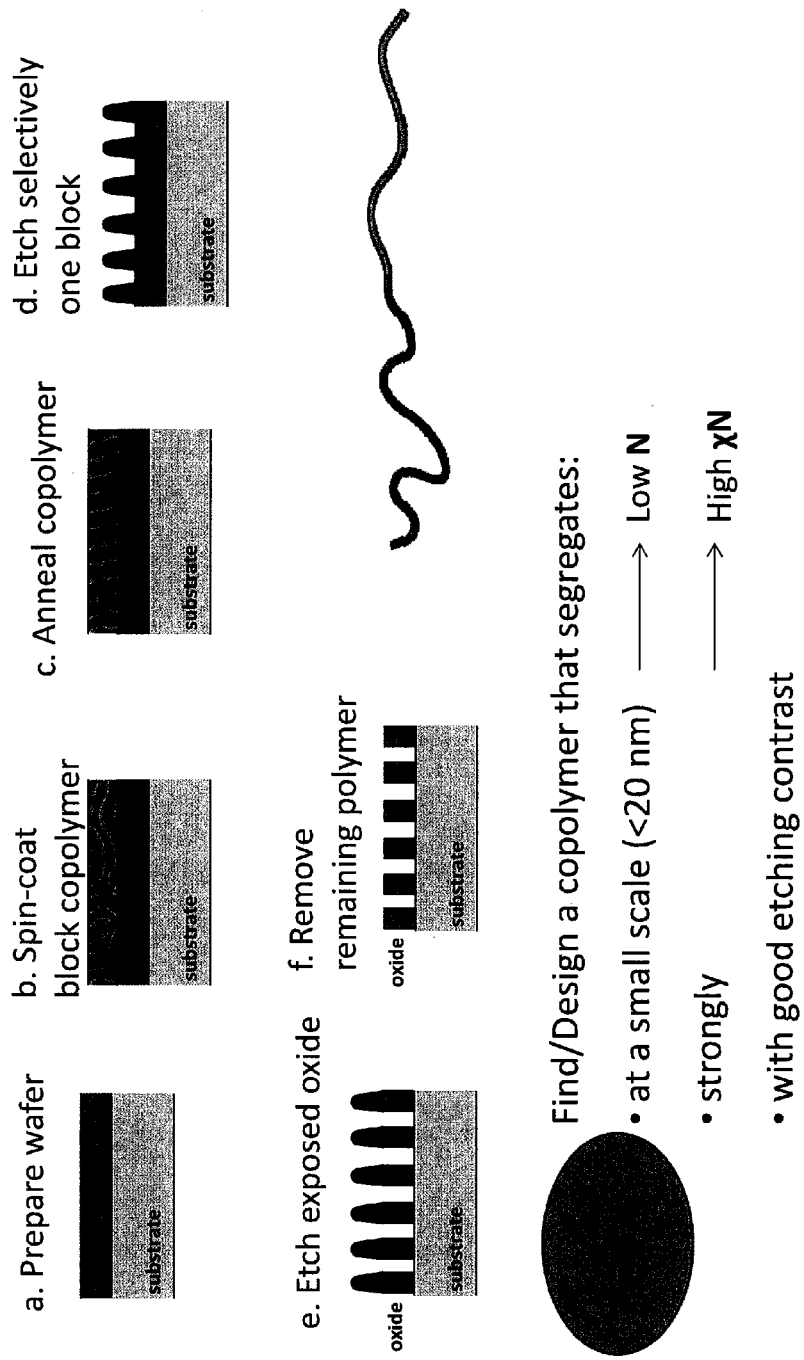
FIG. 12 provides a schematic representation of a lithographic methods materials and systems useful in embodiments of the invention.

Embodiments of the present invention are specifically designed so that the block copolymer comprises an inorganic region (e.g. one comprising a silicon atom) while the additive specifically does not comprise an inorganic region. In these embodiments of the invention, the additive as well as the hydrogen bonding donor block are fully organic (e.g. lack silicon atoms) so that these elements can be removed in certain lithographic applications (e.g. used as sacrificial templates). In particular, compositions having this constellation of elements help to organize the silicon-containing phase, yet can also be specifically etched or degraded by techniques such as $O_2$ plasma etching (see, e.g. FIG. 12). More specifically, embodiments of the invention using the copolymer compositions, such as porous silica membranes or masks for lithography, must have this constellation of elements to function. In this context, copolymers compositions that, for example, are formed from elements including a copolymer that does not include silicon atoms and/or an additive that does include silicon atoms will not function in the lithographic methodologies described herein (and instead will compromise the operability of such methods).

As discussed below, embodiments of the invention are useful in new lithographic processes. The development of new lithographic processes, as well as materials useful in such processes, is of increasing importance in making fabrication of small-scale devices easier, less expensive, and more versatile. Methods of fabricating small-scale devices that addresses some of the drawbacks of conventional lithographic techniques include block copolymer lithography, where use is made of polymer masks derived from self-assembly of block copolymers. Block copolymers are known to form nano-scale microdomains by microphase segregation. In the fabrication of the block copolymer, the microdomains may rearrange into a self-assembled array by microphase segregation to achieve a thermodynamic equilibrium state by, for example, treating the block copolymer with heat and/or a solvent. When cast on a substrate and treated, block copolymers form nano-scale periodic patterns that may be useful as an etch mask in semiconductor device fabrication. Such ordered patterns of isolated structural units formed by the self-assembled block copolymers may potentially be used for fabricating periodic structural units and, therefore, have promising applications in, for example, semiconductor, optical, and magnetic devices. Dimensions of the structural units so formed are typically in the range of 5 nm to 100 nm, which dimensions are extremely difficult to define using conventional lithographic techniques. As discussed below, the size, shape and other characteristics of these domains may be modulated by controlling the constituents of the block copolymer compositions.

Embodiments of the invention include nanolithographic methods (e.g. methods designed to form structures having features between 5 and 100 nm in size). In some embodiments of the invention, such methods comprise the steps of forming a layer of a mask material over a substrate comprising one or more layers of material, wherein the mask material comprises a block copolymer composition that includes an organosilicon block, an organic block, one or more moieties comprising a hydrogen bond donor or a hydrogen bond acceptor, and an organic additive including one or more moieties comprising a hydrogen bond acceptor or a hydrogen bond donor. In such methods, the hydrogen bonds formed between the moieties in the block copolymer and the moieties in the organic additive produce ordered arrangements of atoms in the composition that facilitate the formation of nano-structures (e.g. those of an approximately 10-nm scale). Optionally, the specific additive used in these methods is selected for an ability to selectively swell the organosilicon block or the organic block, thereby increasing or decreasing a size of a feature formed by the method. For example, in some embodiments of the invention, an additive is selected for its ability to swell a copolymer material structure of a feature such as a cube, block or ridge structure, thereby increasing the size of this feature. In some embodiments of the invention, the additive swells a feature such as a cube, block or ridge structure that is proximal to a channel feature so as to decrease channel size, for example by compressing block copolymer materials in the channel. In embodiments of the invention where the substrate comprises one or more layers of material, such layers can comprise materials commonly used in lithographic processes and/or semiconductor fabrication processes. For example, in some embodiments of the invention, such layers of material can include, for example, a substrate layer that is part of a full or partial wafer of semiconductor material and/or a material such as glass or sapphire. The layer of material can include a dielectric material and/or a semiconductive material and/or an insulative material. The material can also be a magnetic recording medium. The dielectric material may be provided over and in contact with a surface of the base substrate. By way of example and not limitation, the dielectric material may include silicon oxynitride (SiON), silicon nitride, silicon dioxide, another oxide material, or a polymer material. The semiconductive material can include, for example, a doped polysilicon material and may be formed over and in contact with the dielectric material using conventional techniques. The insulative material can be formed over the semiconductive layer and can include an oxide such as silicon dioxide. The magnetic recording medium can be comprised of a film stack with different components, containing for example layers of CoZrNb and CoPt alloys separated by a Ru layer. Lithographic methods of the invention can include additional steps such as annealing the mask material on the substrate followed by one or more etching steps. The term "annealing" or "anneal" as used herein means and includes treatment of the block copolymer so as to enable sufficient microphase segregation between the two or more different polymeric block components of the block copolymer to form an ordered pattern defined by repeating structural units formed from the polymer blocks. Annealing of the block copolymer in the present invention may be achieved by various methods known in the art, including, but not limited to: thermal annealing (either under ambient atmospheric conditions, or in a vacuum or in an inert atmosphere, such as nitrogen or argon), solvent vapor-assisted annealing (either at or above room temperature), or supercritical fluid-assisted annealing. As a specific example, thermal annealing of the block copolymer may be conducted by exposing the block copolymer to an elevated temperature that is above the glass transition temperature (Tg), but below the degradation temperature (Td) of the block copolymer.

Typically in the lithographic methods of the invention, the annealed mask material is then exposed to an etching process selected for its ability to etch the organic block and the organic additive of the block copolymer composition in a manner that exposes a portion of the layered substrate (e.g. oxygen reactive ion etching). Certain embodiments can further include exposing the resist material to a further etching process selected for its ability to etch the portion of the substrate exposed by the previous etching step(s). Embodiments of the invention can include additional methodological steps, for example those designed to remove remaining polymer following the formation of the etched substrate material. In these methods, structures having features between 5 and 100 nm in size are formed. Such features include width, height, length, diameter, as well as the distances between elements. In typical embodiments of the invention structures formed by these methods can comprise apertures, pores, channels, columns or wires.

In embodiments of the invention, the copolymer composition is applied onto a substrate comprising one or more layers of materials. For example, the copolymer, more specifically the solution of the copolymer, can be applied by spin-coating to form a thin and uniform layer. However, the copolymer may also be applied by dip-coating, spray-coating, applying liquid droplets or other appropriate coating methods known in the art. In these lithography systems, the mask composition comprises a block copolymer including an organosilicon block, an organic block, and one or more moieties comprising a hydrogen bond donor or a hydrogen bond acceptor as well as the organic additive including one or more moieties comprising a hydrogen bond acceptor or a hydrogen bond donor. As discussed above, these compositions are shown to be particularly useful in lithographic systems due to the fact that the hydrogen bonds formed between the moieties in the block copolymer and the moieties in the organic additive produce ordered arrangements of atoms in the composition. Lithography system embodiments of the invention can include conventional apparatuses used to practice methods of the invention (e.g. spin coaters, reactive ion etch plasma chambers and the like). Embodiments of the invention include lithography systems such as those that provide a substrate that can comprise one or more layers of material (e.g. one comprising a polystyrene, a stainless steel, a glass, a silicon oxide material etc.) and a mask composition disposed over the layered substrate. As used herein, the term "substrate" means and includes base materials upon which compositions of the invention are disposed. The substrate can include materials used in semiconductor substrates, base semiconductor layers on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. One or more substrate layers may be doped or undoped.

Related embodiment of the invention include structures useful in semiconducting including, for example, one or more typical semiconductor elements such as a substrate, a dielectric material, a semiconductive material, and an insulative material. In embodiments of the invention, the substrate can comprise layers of these materials on which a composition of the invention is disposed and can comprise a full or partial wafer of semiconductor material or a material such as glass or sapphire. By way of example and not limitation, a layered substrate may include silicon oxynitride (SiON), silicon nitride, silicon dioxide, another oxide material, or a polymer material, and may be formed using, for example, chemical vapor deposition (CVD), physical vapor deposition (PVD), or atomic layer deposition (ALD). As noted above, embodiments of the invention are used for the fabrication of organized structures with 5-100 nm features. In some embodiments, these lithography systems are used to fabricate repeating structures having features that are between 5 and 100 nm in size. Such structures can include, for example, tunnels or pores having a diameter of less than 100, 50, 25 or 10 nm (and/or a depth of less than 5, 10 or 15 nm), channels or troughs having a width of less than 100, 50, 25 or 10 nm (and/or a depth in a range of from about 5, 10 or 15 nm to about 50 nm), ridges or columns having a width of less than 100, 50, 25 or 10 nm (and/or a height in a range from about 5, 10 or 15 nm to about 50 or 100 nm), or wires having a diameter of less than 100, 50, 25 or 10 nm etc. Such nanolithographic features are well known in the art and can be used in a wide range of applications, such as porous silicate structures, membranes back-filled with liquids, semiconductor fabrication and the like (see, e.g. U.S. patent application publication Nos. 20080182402, 20090273051, 20090202952 and 20120273762, the contents of which are incorporated herein by reference).

Embodiments of the invention also provide articles of manufacture and kits useful in lithographic processes. In one illustrative embodiment, the kit includes the polymeric compositions disclosed herein coated onto a substrate comprising one or more layers of material in combination with other materials useful to fabricate nanostructures such as those having features that are between 5 and 100 nm in size. Other embodiments of the invention include articles of manufacture that include an ordered and nano-structured morphology of a composition which has a block copolymer and an organic additive. The ordered and nano-structured morphology results from hydrogen bonding between the block copolymer and the additive, and wherein the additive comprises functional groups capable of hydrogen-bonding. The article of manufacture may be, for example, a component of a lithographic system, a component of a photovoltaic system, a component of a battery system, a component of a photonics system, a component of a artificial membrane system, a component of a water purification system, a component of a fuel cell system, a component of a display system, a component of data storage system, a component of a resist system for device patterning, or a component of a flexible electronics system.

EXAMPLES

The following examples are given to aid in understanding the invention, but it is to be understood that the invention is not limited to the particular materials or procedures of examples.

Example 1

Illustrative Methods and Materials for the Long Range Ordering of Poly(Ethylene Oxide-Block-Dimethylsiloxane)

To illustrate working embodiments of the invention, poly (ethylene oxide-block-dimethylsiloxane) (PEO-PDMS), with respective block molecular weights of 2.4 kg/mol and 1.2 kg/mol and PDI of 1.17 was obtained from PolymerSource (Dorval, Canada). This copolymer was then blended in various ratios with (L)-Tartaric acid ((L)-TA, Sigma Aldrich, 98%) by solvent casting from 30 wt % THF solutions. The blends cast in that manner were subsequently dried under vacuum and then vacuum-annealed for at least 12 h at 100° C.

The thermal properties of the blends were measured with a DSC Q2000 apparatus from TA instruments (standard procedure was used, with heating/cooling ramps of 10° C./min). The DSC thermograms are shown on FIG. 1, and demonstrate how the crystallization of a semi-crystalline hydrogen bonding block can be suppressed by the addition of a small molecule additive that interacts with this block.

Structural analysis was determined by small angle X-Ray scattering (SAXS) using the x-ray diffraction facility in the Materials Research Laboratory (MRL) at UCSB. The instrument used a 50 micron microfocus, Cu target x-ray source with a parallel beam multilayer optics and monochromator (Genix from XENOCS SA, France), high efficiency scatterless hybrid slits collimator developed in house, and Mar345 image plate detector (Mar Research, Germany). Typical q range for measurement spans 0.01-0.25 inverse angstrom.

Figure 2:
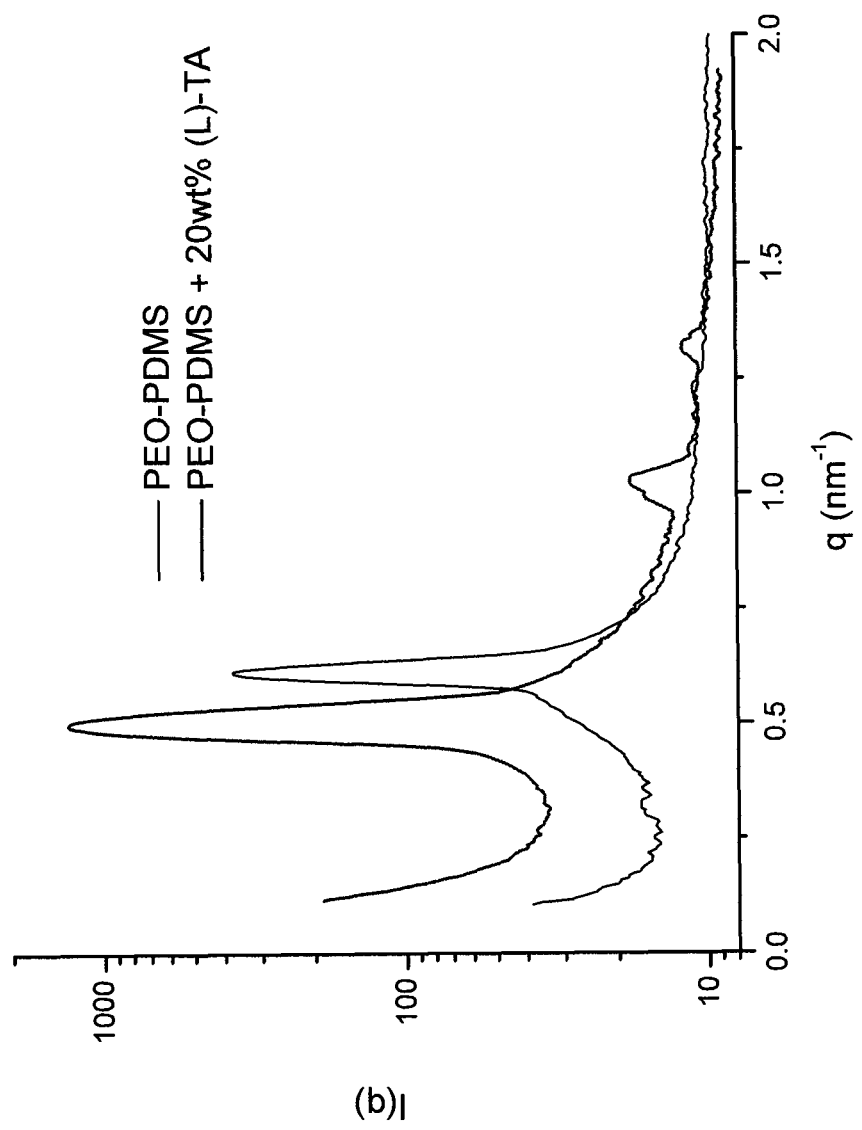
FIG. 2 shows small-angle X-ray scattering (SAXS) spectra obtained at 60° C. for pure PEO-PDMS copolymer and the blend with 20 wt % (L)-TA additive. Improved ordering can be determined for the blend with 20 wt % additive in view of the increase of the main scattered intensity and the presence of higher order scattering peaks.

FIG. 2 shows the spectra obtained at 60° C. for the pure PEO-PDMS copolymer and for the blend with 20 wt % (L)-TA additive, illustrating how the addition of a hydrogen bonding additive is able to generate ordered arrangements of atoms in the composition and significantly improve long range ordering in the system.

Figure 3:
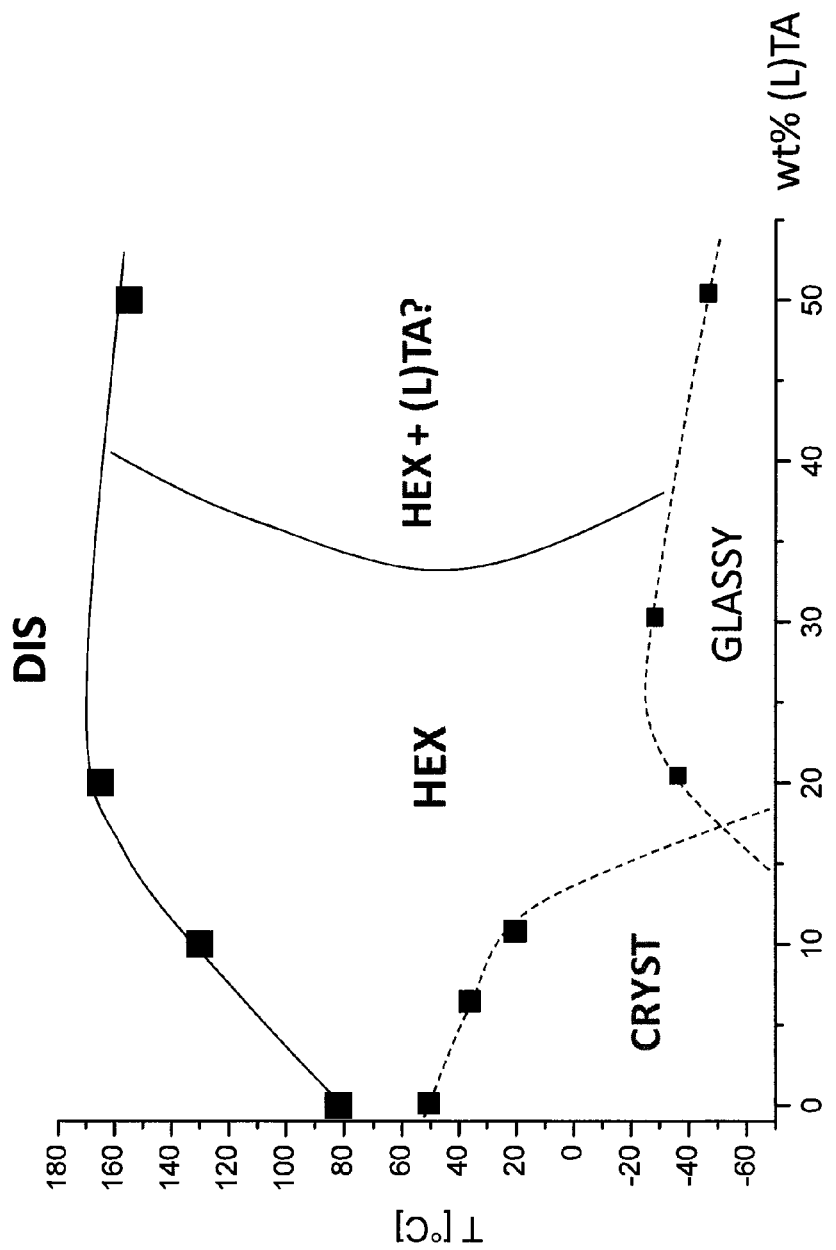
FIG. 3 shows a phase diagram of PEO-PDMS copolymer blended with different amounts of (L)-TA (fraction given by % weight of the total). In total, 4 different phase types could be determined with SAXS analysis: CRYST=crystallization of the PEO blocks, HEX=hexagonal cylinders, DIS=disordered, HEX+(L)-TA=coexistence of a phase with hexagonal cylinders and a pure (L)-TA phase (the order-disorder transition $T_{ODT}$ was raised by up to 85° C.).

The phase diagram of PEO-PDMS blended with different amounts of (L)-TA additive (FIG. 3) was constructed by determining the order-disorder transition (ODT) for various blend compositions. The measurement of ODT was performed by monitoring the broadening of the main scattering peak width with temperature, and the determination of the phase type was done by analyzing the position of the higher order scattering peaks. The phase diagram shows an increase in the ODT transition by 85° C. with the addition of 20 wt % of L-tartaric acid, demonstrating how the segregation strength of the system can be increased.

The domain spacings (FIG. 4) were determined from the SAXS spectra at 60° C., using the relation $d=2\pi/q^*$, with $q^*$ being the position of the main scattering peak; thereby demonstrating that the size of the features can be fine-tuned by altering the wt % of the additive.

Figure 4:
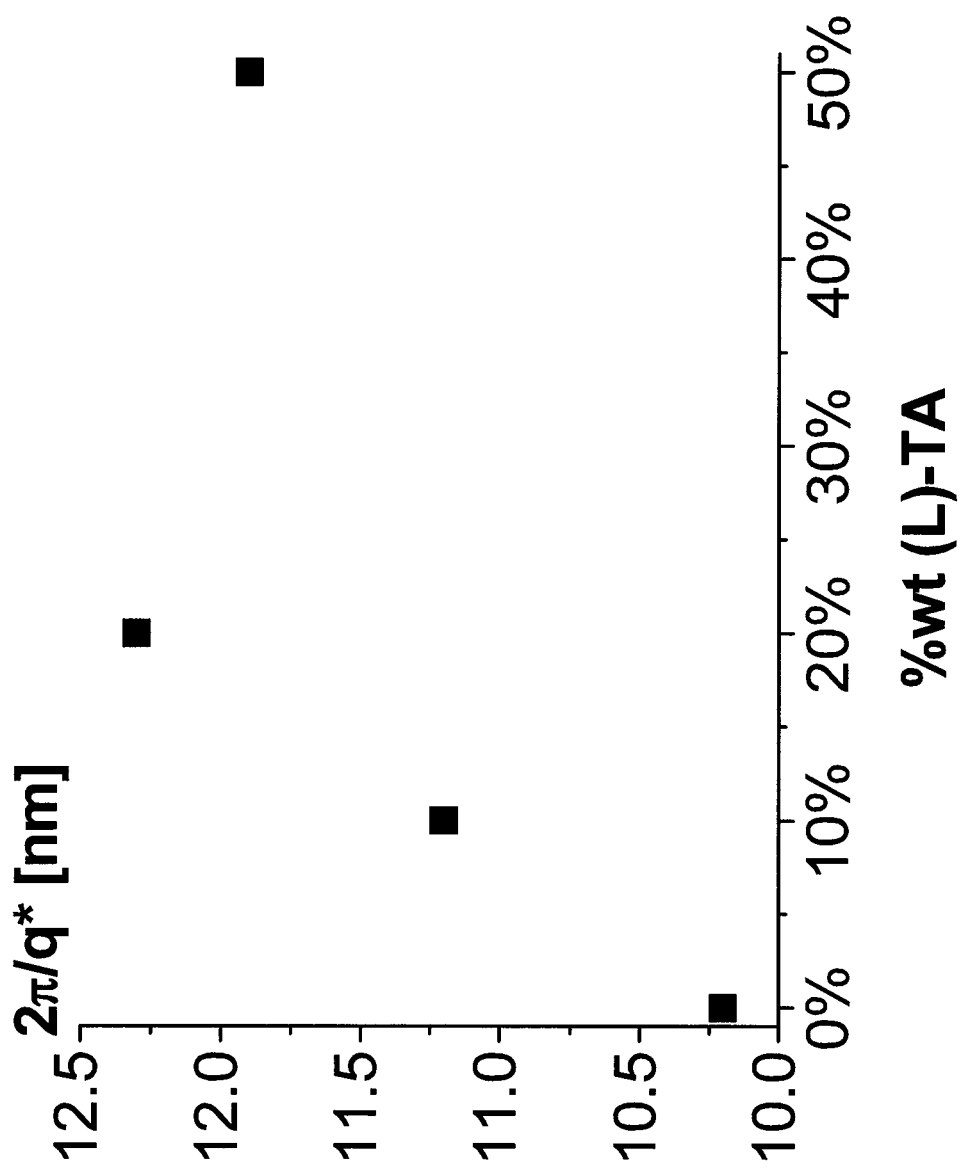
FIG. 4 shows a graph of data illustrating domain spacing at 60° C. for the different blend compositions.

Upon addition of 20 wt % of (L)-TA additive to the PEO-PDMS copolymer, the following material properties were observed: i) suppression of crystallization upon cooling and an increase of the $T_g$ of the PEO phase from −75° C. to −35° C. (FIG. 1), ii) an improved long-range ordering (FIG. 2), iii) the increase of segregation strength (FIG. 3) and iv) an increase of the domain spacing from 10.2 to 12.3 nm (FIG. 4). When amounts of (L)-TA additive higher than 20 wt % were used, the domain spacing and the ODT were found to decrease. This suggests that the additive does not swell the PEO phase, but both PDMS/PEO+(L)TA hexagonal phase and a pure (L)-TA phase are co-existing. This also suggests that in all block copolymers there is an optimum amount of additive (e.g. from 10 to 40 wt %, and optionally from 15 to 30 wt %) that can be used to best improve the assembly of the copolymer.

Example 2

Phase Separation in Silicon-Containing Block Copolymers

This Example describes the synthesis of embodiments of the copolymer compositions that show high segregation strength. Such features enable enhanced ordering, as well as decreased size ordering features. The illustrative PDMS-containing copolymers are used as examples of embodiments of the inventions used in these experiments because, for example, they provide a robust and selective mask for standard plasma etching techniques and are therefore particularly well fitted for nanolithography.

As disclosed above, small organic molecules additives can improve the phase separation in diblock copolymers. In the illustrative system disclosed herein, PEO-PDMS+(L) Tartaric acid, the diblock copolymer contained a silicon block as well as hydrogen bonding acceptor block, whereas the additive was a hydrogen bonding donor. The strong hydrogen bonding in this system induced a significant increase of the order-disorder temperature ($T_{ODT}$). Phase diagrams of the system (Temperature vs. Additive fraction) were determined and this behavior was further generalized to other hydrogen bonding acceptor blocks or hydrogen bonding donor additives. To illustrate the versatility of embodiments of the invention, the synthesis of azido functional PDMS polymers by anionic polymerization can be used to develop a large library of diblocks with PDMS and hydrogen bonding acceptors (e.g. PEO, PAGE, PMMA, P4VP and the like).

Synthesis of Diblocks with PDMS and Hydrogen Bonding Acceptors

Figure 5:
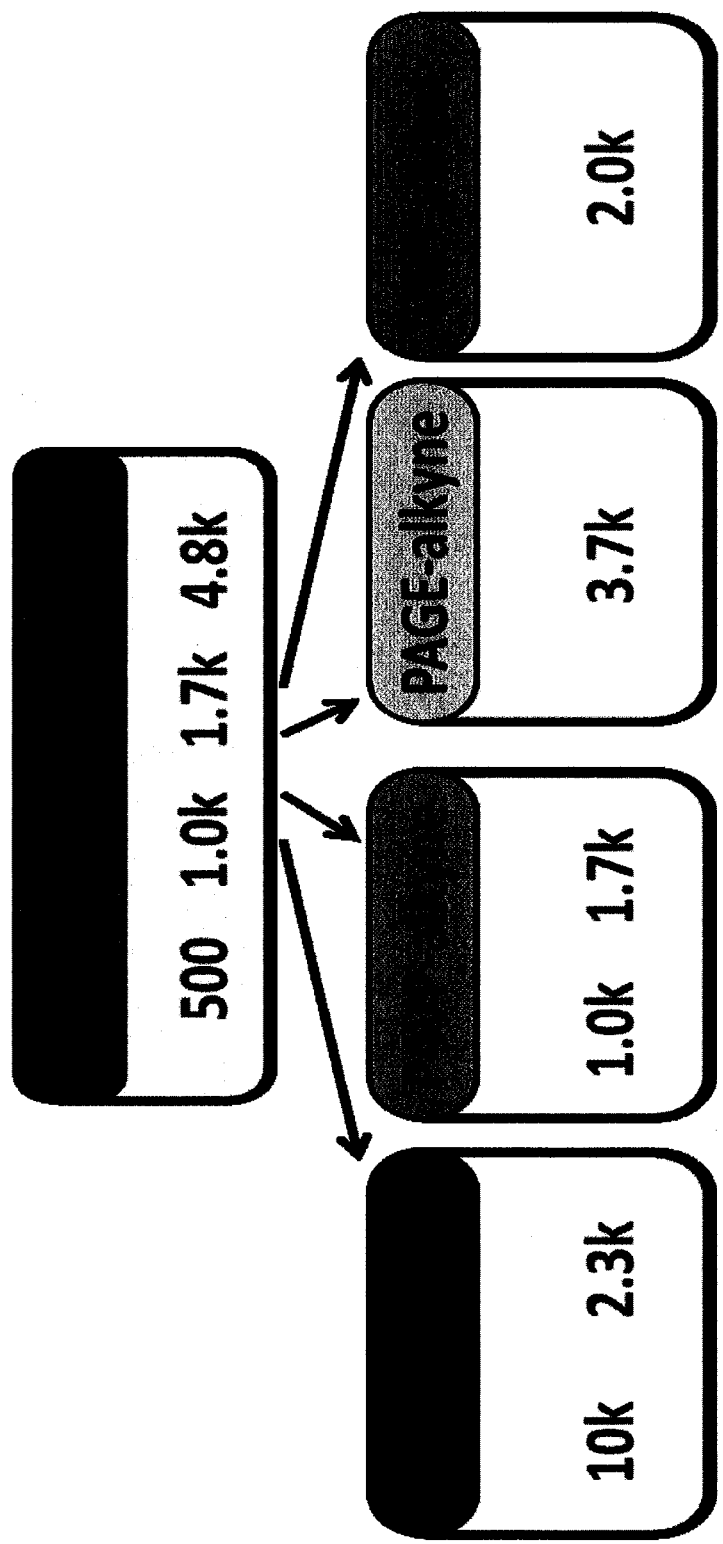
FIG. 5 shows a diagram of the library currently accessible from the combination of PDMS-N3 blocks and various alkyne-functional blocks.

As an illustration of the phase separation in a number of PDMS-containing copolymers, a modular strategy by coupling azido-functional PDMS and alkyne-functional polymers through Copper catalyzed Azide-Alkyne Cycloaddition (CuAAC) was developed. This modular approach allows one to combine quickly different blocks and obtain a large library of accessible diblocks (FIG. 5). Sequential metal-free anionic polymerization can be an alternative for some of these polymers and should give access to lower PDIs.

PDMS-Azide Block

Figure 6:
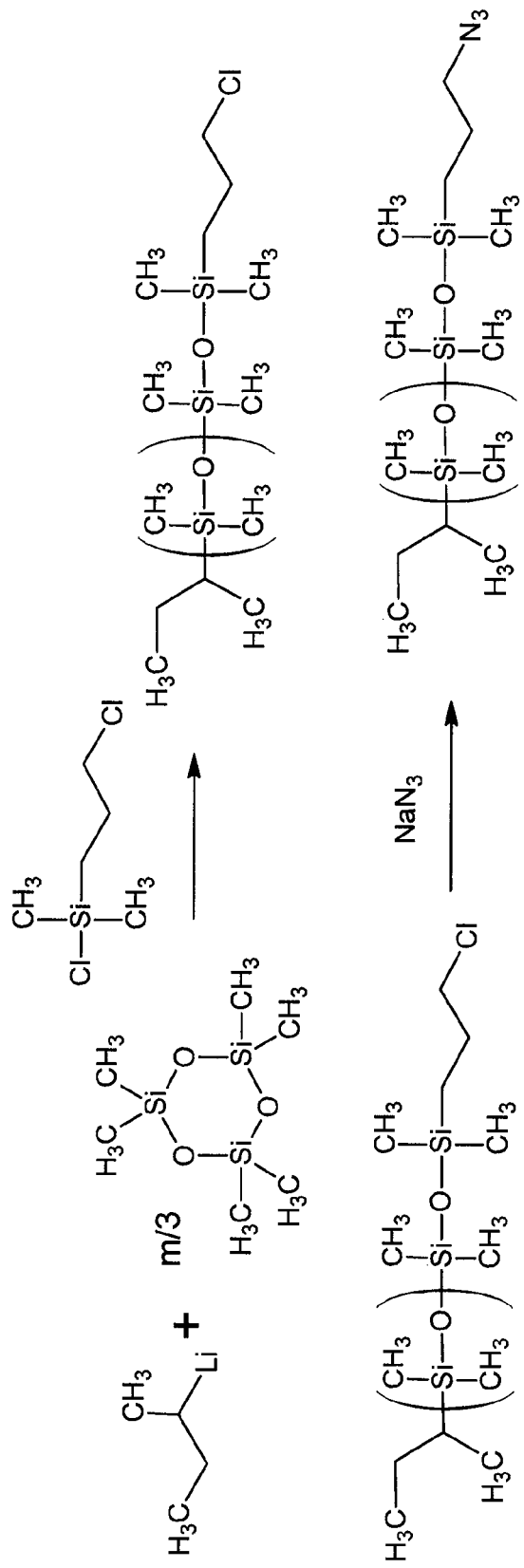
FIG. 6 shows a diagram of Scheme 1: Anionic synthesis of azide-functionalized PDMS polymers.

A strategy used to obtain azide-functional PDMS is described in Scheme 1 as shown in FIG. 6. In the different syntheses realized, the molecular weight ranged from 500 g/mol to 4800 g/mol. All syntheses were realized at the 5 to 15 g scale.

The chloropropyl-PDMS obtained after the first step is purified by reprecipitation in cold MeOH. Although this method works well for molecular weights above 1500 g/mol, the solubility of PDMS in MeOH increases for low molecular weights and the yields decrease considerably. Embodiments of the invention can add 10 to 20 wt % of water for the lower molecular weights (1000 g/mol and 500 g/mol). The displacement of the chloride by $NaN_3$ in the second step is strongly limited by the choice of the solvent, and particularly the solubility of PDMS. DMF (the standard solvent for displacement with $NaN_3$) offers low yields. Solubility of PDMS was increased by using a mixture of 50 wt % DMF+50 wt % dimethoxyethane as a solvent. With the use of a microwave reactor, complete reaction was observed after 5 h at 100° C.

Synthesis of Alkyne-Functionalized Blocks

Figure 7:
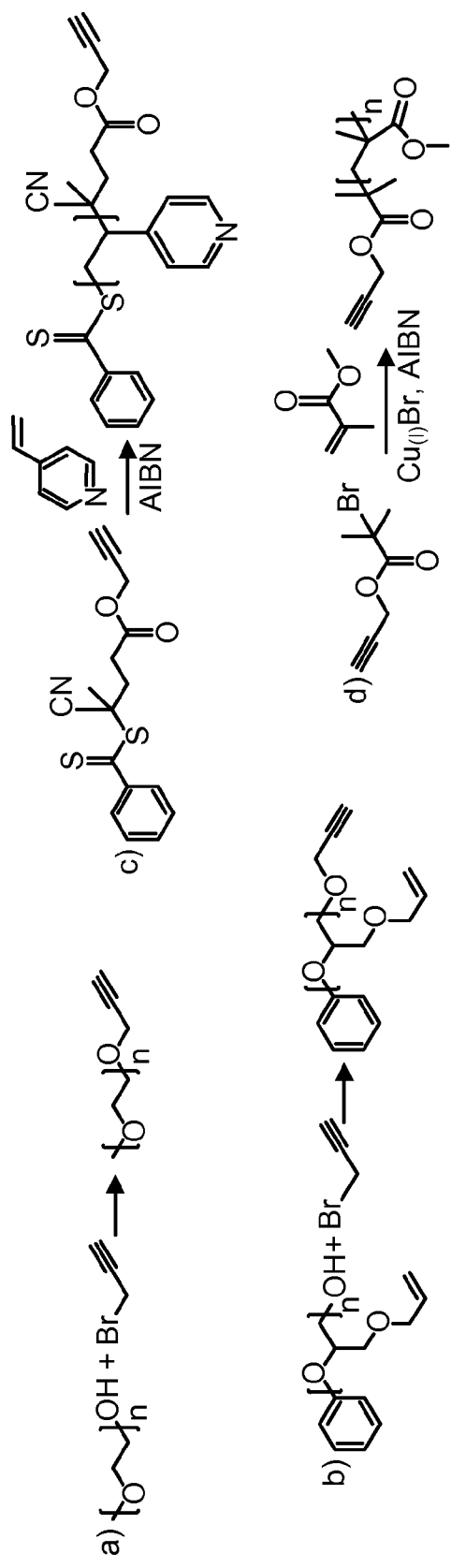
FIG. 7 shows a diagram of Scheme 2 Synthesis of alkyne-functionalized polymers by a) and b) anionic polymerization of PEO (purchased) and PAGE followed by reaction with propargyl bromide c) reversible addition-fragmentation chain transfer (RAFT) polymerization (of P4VP) and d) Atom transfer radical polymerization (ATRP) polymerization (of PMMA).

Different polymers with low PDI and alkyne end-groups were synthesized using three different methods:
ATRP for PMMA
RAFT for P4VP
Anionic synthesis for PAGE and PEO
The synthesis strategies followed conventional procedures and can be found in Scheme 2 as shown in FIG. 7.

Diblock Coupling and Purification

Figure 8A:
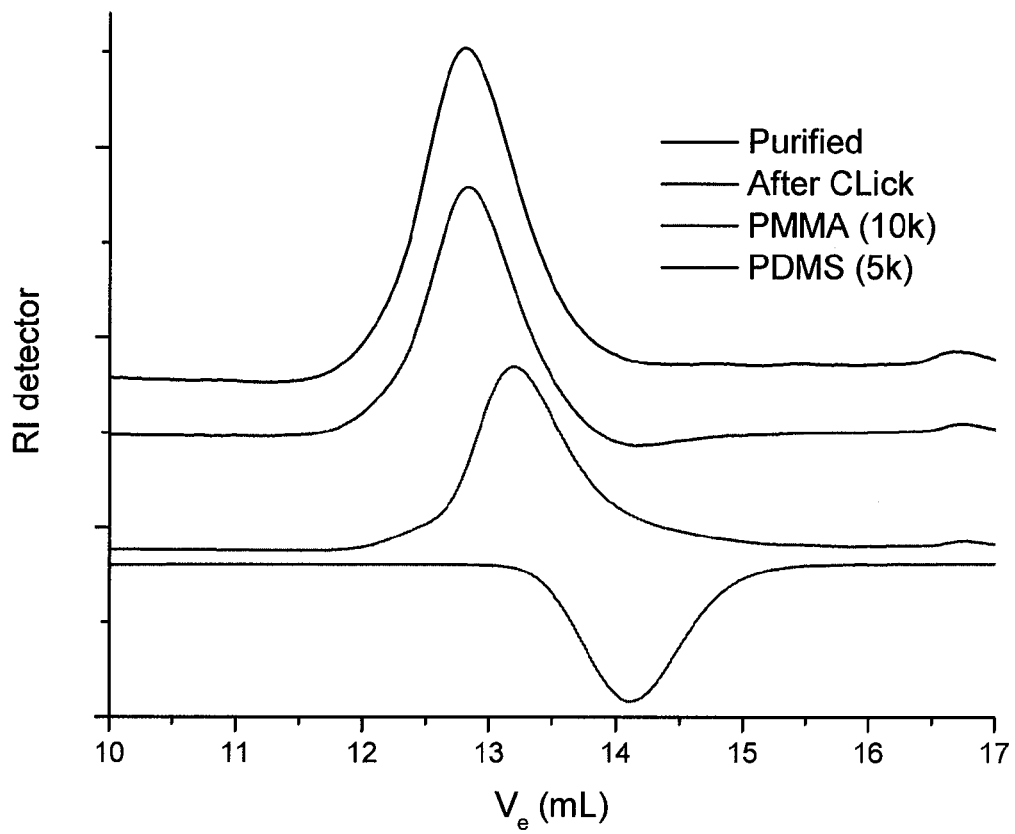
FIGS. 8A and 8B provide graphs of data from GPC traces (in CHCl$_3$, RI detector) showing purification of PDMS$_{4.8k}$-PMMA$_{10k}$ and PDMS$_{4.8k}$-PAGE$_{3.7k}$ diblocks.
Figure 8B:
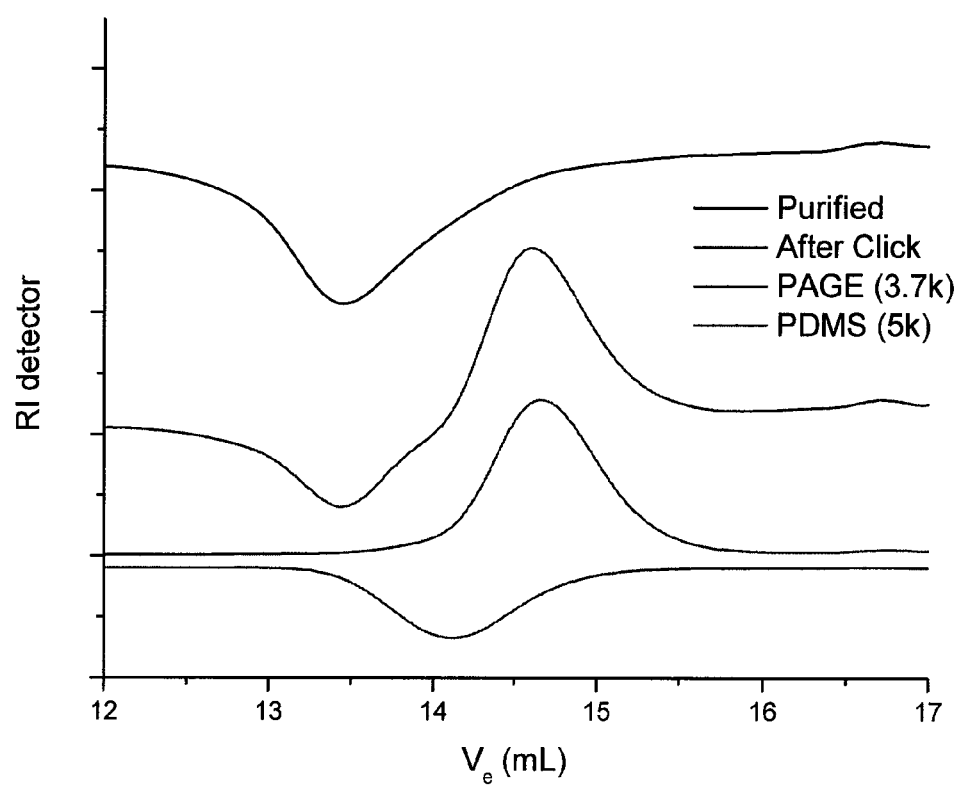

The coupling of the azide-functionalized PDMS and the alkyne-functionalized polymers is realized using previously described methods (with Cu nanoparticles as catalyst, 30 min at 140° C. in microwave). All reactions were conducted in toluene. Purification, and especially the removal of homopolymers, was achieved by several precipitation in solvent/non-solvent mixtures and monitored with GPC (FIGS. 8A and 8B).

Estimation of Flory-Huggins Parameters for PDMS-Containing Diblocks.

As shown by the data presented herein, aspects of Flory-Huggins theory (e.g. Chi parameters) can be used to characterize the properties and/or effects of different additives in various block copolymer environments (e.g. in order to characterize the effects/properties additives in various block copolymer environments).

Methods for Measuring Flory-Huggins Chi Parameters

Flory-Huggins parameters ($\chi$) can be estimated using various methods. In the working examples, the well established methodology of Hashimoto and coworkers, one which takes into account asymmetry and polydispersity, was used (see, e.g., Sakurai et al. Macromolecules 25, 2679-2691 (1992)). This methodology allows artisans to estimate the temperature dependence of the $\chi$ parameter between two components, it requires a diblock copolymer and a set of SAXS spectra taken above the ODT of the diblock copolymer. The shape of the main scattering peak is fitted to the theoretical structure factor disclosed in Sakurai et al. by using a least-square algorithm.

The fixed parameters used in this methodology are: the number-average molecular weights of the blocks ($Mn_A$ and $Mn_B$, determined by $^1$H NMR), the polydispersity (PDI, determined by GPC), the monomer volumes ($v_A$ and $v_B$, obtained from the literature) and a reference volume $v_0$ taken to 0.1 $nm^3$. The fitting parameters are: the statistical segment lengths ($b_A$ and $b_B$) and the Flory-Huggins parameter ($\chi$).

As an example, the values of the fixed and adjusted parameters are given below for the $PEO_{2.4k}$-$PDMS_{1.2k}$ diblock copolymer.

| Parameter | M(PDMS) | M(PEO) | PDI | v(PEO) | v(PDMS) | $v_0$ |
|---|---|---|---|---|---|---|
| Value | 1200 g/mol | 2350 g/mol | 1.15 | 0.069 $nm^3$ | 0.138 $nm^3$ | 0.100 nm3 |

| Temperature | b (EO) (nm) | b (PDMS) (nm) | $\chi_{PEO/PDMS}$ |
|---|---|---|---|
| 90° C. | 0.6637 | 0.8706 | 0.1562 |
| 105° C. | 0.6607 | 0.8668 | 0.1559 |
| 120° C. | 0.6572 | 0.8630 | 0.1556 |
| 135° C. | 0.6554 | 0.8555 | 0.1553 |
| 150° C. | 0.6486 | 0.8626 | 0.1551 |
| 165° C. | 0.6468 | 0.8611 | 0.1548 |

Figure 13:
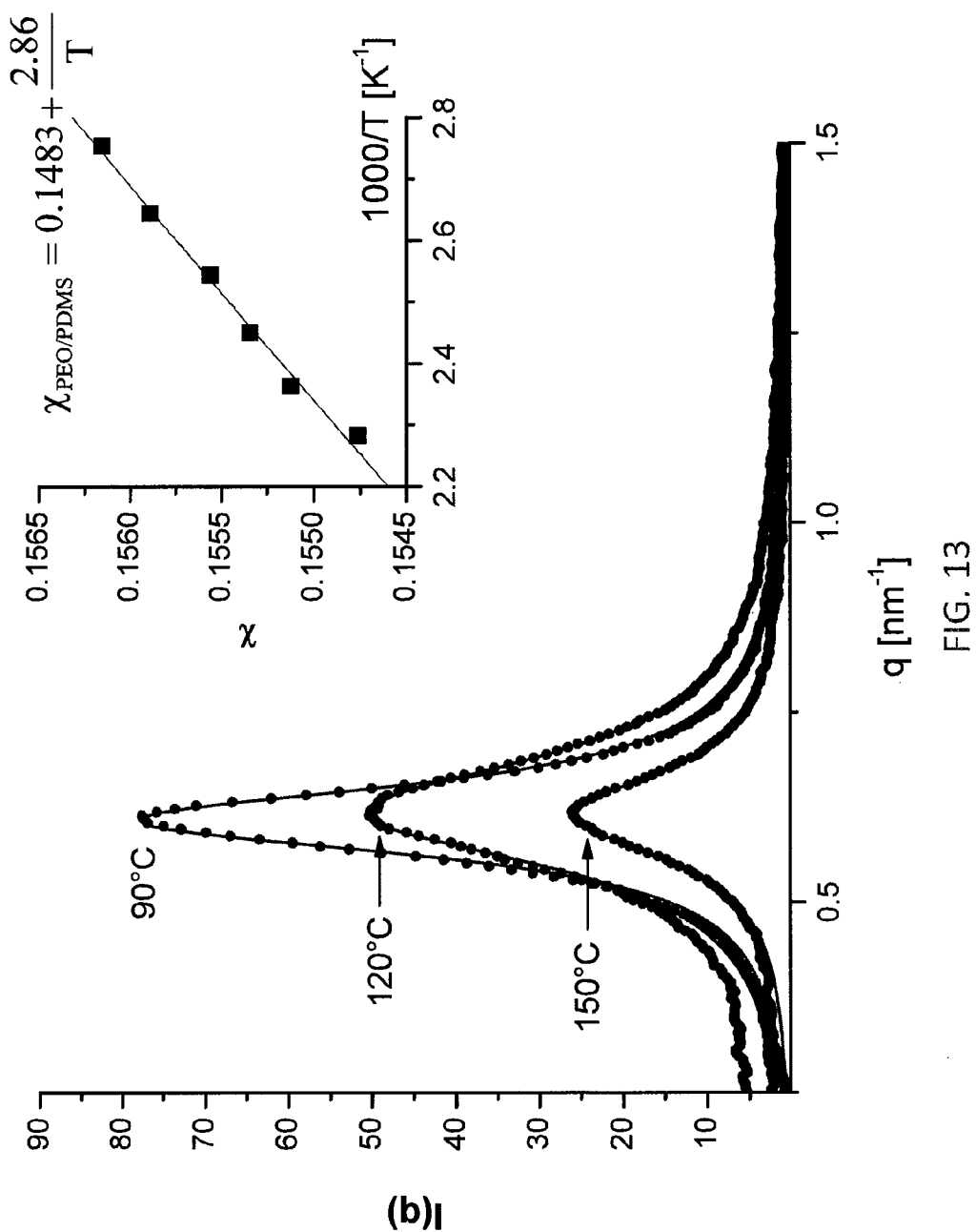
FIG. 13 shows graphical data of SAXS spectra of PEO2.4k-PDMS1.2k diblock taken at 90, 120 and 150° C. (black dots). The corresponding lines are the best fits obtained by varying the bEO, bPDMS and χEO/PDMS parameters.

FIG. 13 shows graphical data of SAXS spectra of PEO2.4k-PDMS1.2k diblock taken at 90, 120 and 150° C. (black dots). The corresponding lines are the best fits obtained by varying the bEO, bPDMS and χEO/PDMS parameters. The temperature dependence of the χEO/PDMS parameter is plotted in the inset.

Figure 9:
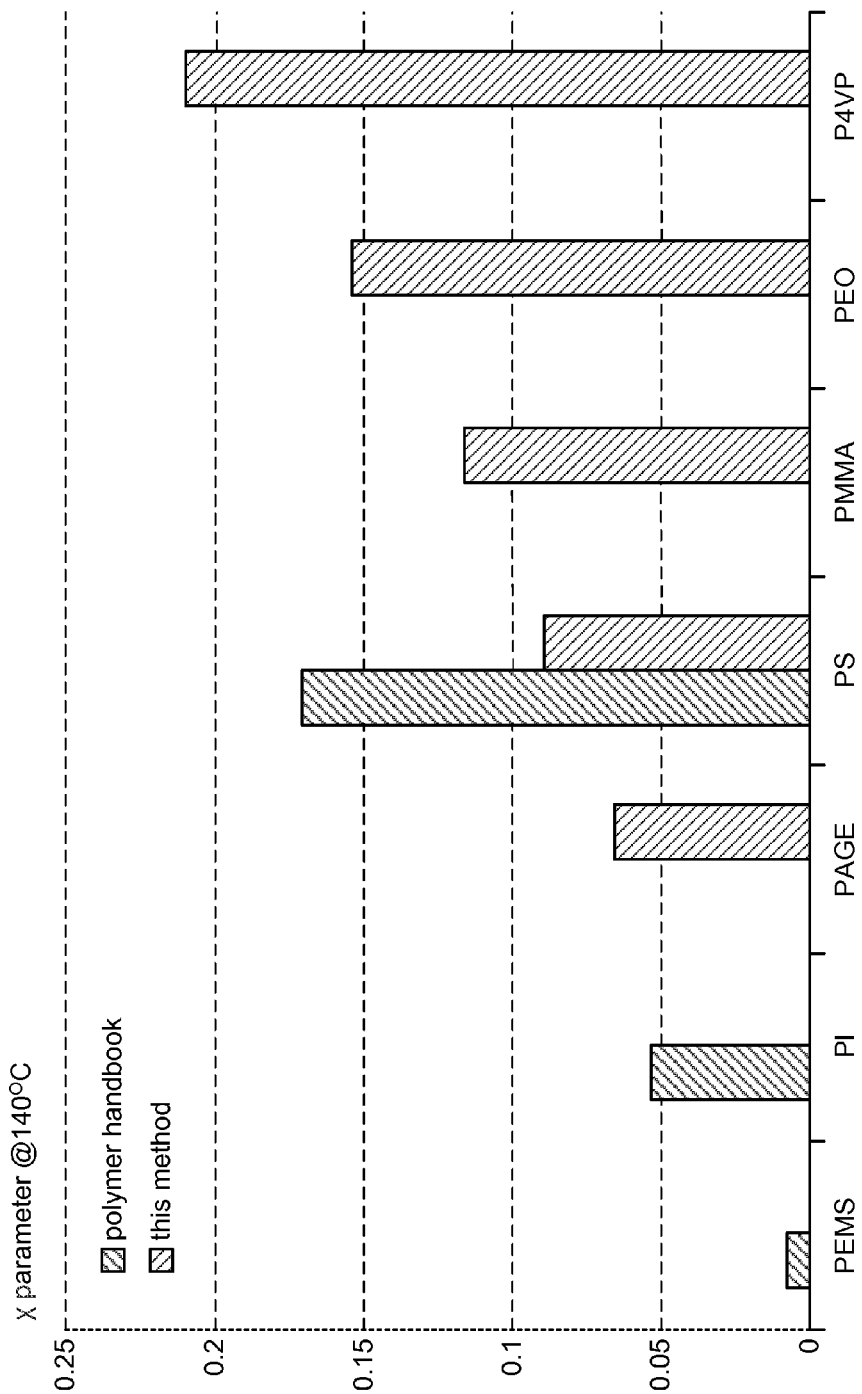
FIG. 9 provides a graph of data on χ parameters at 140° C. estimated from this work and comparison with values reported in the literature. NB: PEMS=poly(ethylmethylsiloxane), PI=poly(isoprene), PS=poly(styrene).

In a working embodiment of the invention, Flory-Huggins parameters (χ) were estimated by analyzing the SAXS spectra of the pure diblocks above $T_{ODT}$, using Hashimoto's theory (which takes into account asymmetry and polydispersity). Values at 140° C. are reported on FIG. 9.

In these studies, values obtained from the literature were estimated from different methods (by synthesizing copolymers with different sizes, using RPA theory to predict the theoretical $(\chi N)_{ODT}$ and measuring $T_{ODT}$ with SAXS). One can synthesize PDMS-PS diblocks and obtain $\chi_{PS-PDMS}$ parameters with the disclosed method for a comparison.

Blends with Hydrogen Bonding Donor Additive

Figure 10:
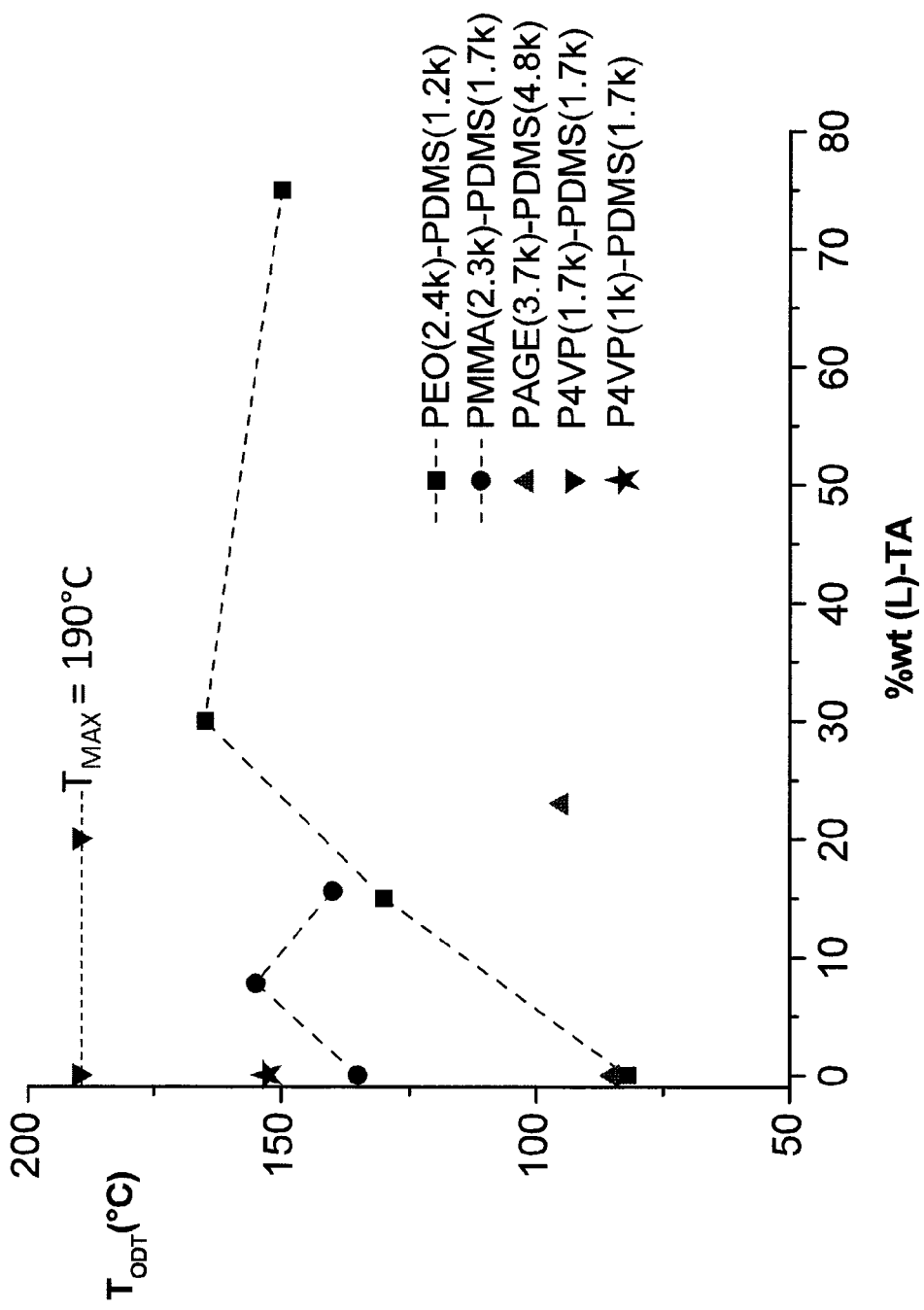
FIG. 10 shows a graph of data from $T_{ODT}$ measured with SAXS for different diblocks/(L)-Tartaric acid blends. Note that a) the % wt of (L)-TA is referenced against the weight of the hydrogen bonding acceptor block, and not against the total weight of diblock and b) the maximal temperature measured was 190° C., and P4VP$_{1.7k}$-PDMS$_{1.7k}$ was still phase-separated.

Investigations of interactions between diblocks and small molecule additives were carried on with the newly synthesized diblock copolymers. For consistency in these analyses, the same hydrogen bonding donor additive was used: (L)-Tartaric acid. Phase separation was then examined with SAXS. Measured $T_{ODT}$ values for different diblocks are reported in FIG. 10.

Without being bound by a specific theory or scientific principle, the available data provides evidence of the following: first, at small fraction of (L)TA, the additive selectively binds to the hydrogen bonding acceptor block and increases its polarity. This enhances the incompatibility with PDMS and thus the observed $T_{ODT}$ values. In addition, the amount of (L)TA that can be bound in this way is limited by the hydrogen acceptor character of the block. At some point, saturation of the binding locations occurs. At higher fractions than the saturation point, the (L)TA acts as a non-specific solvent that can either swell the PDMS phase or form a second phase. In both cases, the consequence is a decrease of the $T_{ODT}$.

Figure 11:
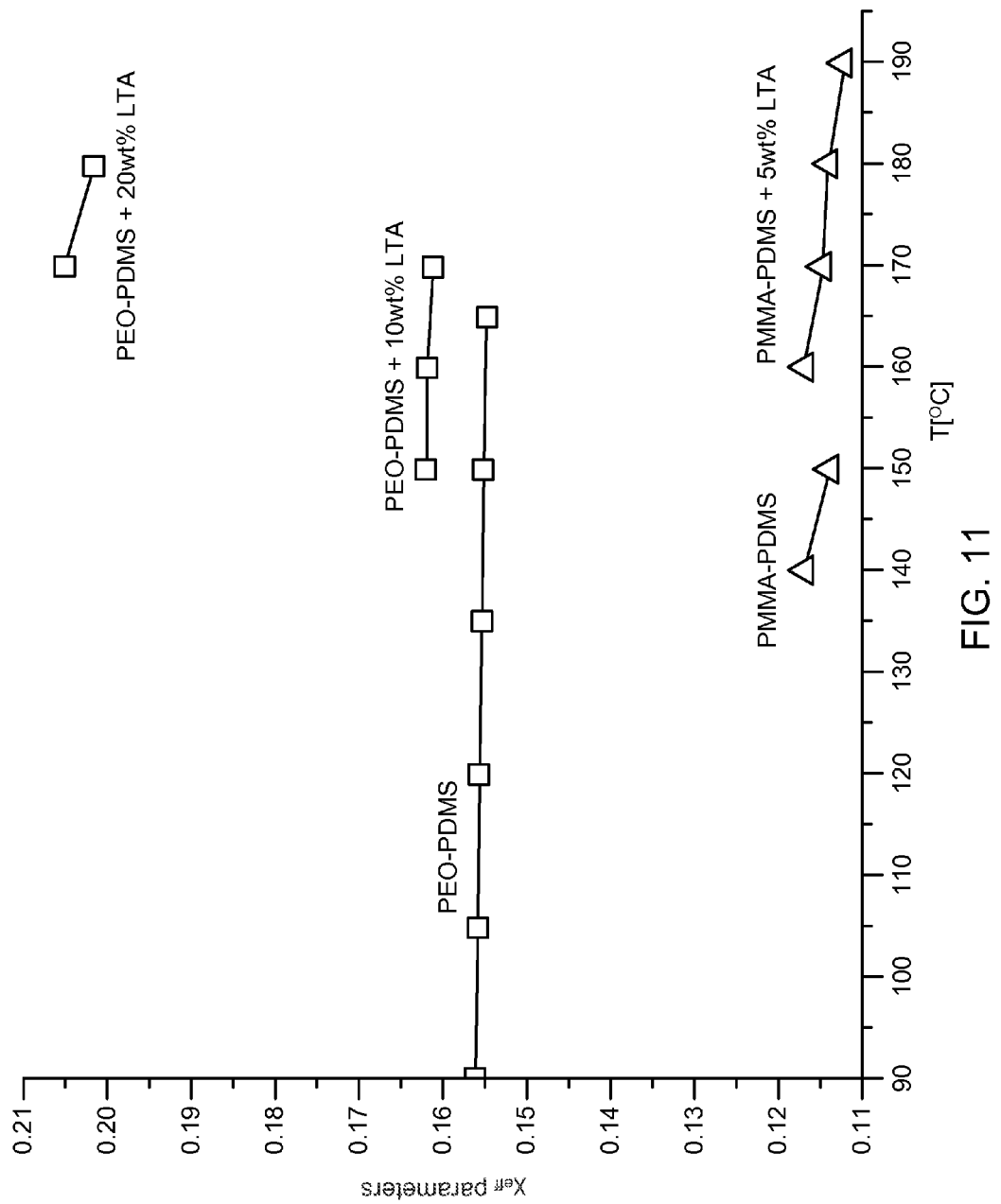
FIG. 11 shows graphical data of effective Chi parameters between PDMS and the "supramolecular blocks" consisting of hydrogen bonding acceptor block bound with hydrogen bonding donor additive. A and B coefficients correspond to the fits with the relation $\chi_{eff}=A+B/T$.

In order to provide a more appreciable and quantitative estimation of the improvement of phase segregation, we assume in the following that in our system, (L)-TA is a solvent specific for the hydrogen bonding acceptor block and that saturation of hydrogen bonding interaction does not occur. The system can then be simplified in a effective diblock system, with a PDMS block and a "supramolecular block" consisting of (L)-TA bound to the hydrogen bonding acceptor block. This assumption should be valid when $T_{ODT}$ increases with the fraction of additive (i.e. <30 wt % for PEO-PDMS and <10 wt % for PMMA-PDMS). One can then carry an analysis of SAXS data in the disordered state and estimate effective χ parameters between PDMS and the "supramolecular block" (see, e.g. FIG. 11).

The invention claimed is:

1. A method for forming structures having features between 5 and 100 nm in size comprising the steps of:
    (a) forming a layer of a mask material over a substrate comprising a plurality of layered materials, wherein the mask material comprises a block copolymer composition including:
        an organosilicon block;
        an organic block; and
        one or more moieties comprising a hydrogen bond donor or a hydrogen bond acceptor; and
        an organic additive including one or more moieties comprising a hydrogen bond acceptor or a hydrogen bond donor, wherein:
        hydrogen bonds formed between the moieties in the block copolymer and the moieties in the organic additive produce ordered arrangements of atoms in the composition;
    (b) annealing the mask material on the substrate;
    (c) exposing the mask material to an etching process selected for its ability to selectively etch the organic block and the organic additive of the block copolymer composition, wherein the etching process exposes a layer of the substrate; and
    (d) exposing the substrate material to a second etching process selected for its ability to etch the layer of substrate exposed by step (c);
so that structures having features between 5 and 100 nm in size are formed.

2. The method of claim 1, wherein the block copolymer comprises a polyol block and a siloxane block.

3. The method of claim 1, wherein the additive comprises from 10 to 40 weight % of the composition.

4. The method of claim 3, wherein the additive is selected for an ability to selectively swell the organosilicon block or the organic block, thereby increasing or decreasing a size of a feature formed by the method.

5. The method of claim 3, wherein an etching process comprises oxygen reactive ion etching.

6. The method of claim 3, wherein the structures comprise pores, channels, columns or wires.

7. A method for forming structures having features between 5 and 100 nm in size comprising the steps of:
    (a) forming a layer of a mask material over a substrate comprising a plurality of layered materials, wherein the mask material comprises a block copolymer composition including:
        an organosilicon block;
        an organic block that does not comprise silicon; and
        one or more moieties comprising a hydrogen bond donor or a hydrogen bond acceptor; and
        an organic additive that does not comprise silicon, the organic additive including one or more moieties comprising a hydrogen bond acceptor or a hydrogen bond donor, wherein:
        hydrogen bonds formed between the moieties in the block copolymer and the moieties in the organic additive produce ordered arrangements of atoms in the composition;
    (b) annealing the mask material on the substrate;
    (c) exposing the mask material to an etching process selected for its ability to selectively etch the organic block and the organic additive of the block copolymer composition, wherein the etching process exposes a layer of the substrate; and
    (d) exposing the substrate material to a second etching process selected for its ability to etch the layer of substrate exposed by step (c);
so that structures having features between 5 and 100 nm in size are formed.

8. The method of claim 7, wherein the block copolymer comprises a polyol block and a siloxane block.

9. The method of claim 7, wherein the additive comprises from 10 to 40 weight % of the composition.

10. The method of claim 9, wherein the additive is selected for an ability to selectively swell the organosilicon block or the organic block, thereby increasing or decreasing a size of a feature formed by the method.

11. The method of claim 9, wherein an etching process comprises oxygen reactive ion etching.

12. The method of claim 9, wherein the structures comprise pores, channels, columns or wires.

13. A method for forming a block copolymer composition; combining a block copolymer with an organic additive, wherein:
the block copolymer includes:
an organosilicon block;
an organic block that does not comprise silicon; and
one or more moieties comprising a hydrogen bond donor or a hydrogen bond acceptor; and
the organic additive does not comprise silicon and includes one or more moieties comprising a hydrogen bond acceptor or a hydrogen bond donor;
such that hydrogen bonds formed between the moieties in the block copolymer and the moieties in the organic additive produce ordered arrangements of atoms in the composition.

14. The method of claim 13, wherein the ordered arrangements of atoms in the composition:
increase the segregation strength of the block copolymer;
increase the glass transition temperature of the block copolymer; and/or
inhibit crystallization of the block copolymer.

15. The method of claim 13, wherein the additive comprises from 5 to 40 weight % of the composition.

16. The method of claim 13, wherein the additive comprises a monosaccharide, a polyphenol, an aromatic polyacid or a 2,3-dihydroxybutanedioic acid.

17. The method of claim 13, wherein the block copolymer comprises:
a poly(ethylene oxide) block, a Poly(methyl methacrylate) (PMMA) block, a Poly(4-vinylpyridine) (P4VP) block or a P4VP-r-PMMA; and/or
a polydimethylsiloxane block.

18. The method of claim 13, wherein the organic block of the block copolymer comprises one or more moieties having a hydrogen bond acceptor and the organic additive comprises one or more moieties having a hydrogen bond donor.

19. The method of claim 13, further comprising a silicon oxide composition, wherein the block copolymer forms a discrete layer over the silicon oxide composition.

\* \* \* \* \*